(12) United States Patent
Caubet et al.

(10) Patent No.: US 7,687,399 B2
(45) Date of Patent: Mar. 30, 2010

(54) PRODUCTION OF A SELF-ALIGNED CUSIN BARRIER

(75) Inventors: Pierre Caubet, Le Versoud (FR); Nicolas Casanova, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 117 days.

(21) Appl. No.: 11/476,428

(22) Filed: Jun. 28, 2006

(65) Prior Publication Data

US 2007/0035029 A1    Feb. 15, 2007

(30) Foreign Application Priority Data

Jul. 7, 2005    (FR) .................................. 05 07269

(51) Int. Cl.
*H01L 29/40* (2006.01)
(52) U.S. Cl. ....................... 438/683; 257/762
(58) Field of Classification Search ............. 257/762, 257/E23.161, E21.081, E21.199; 438/581, 438/687, 683
See application file for complete search history.

(56) References Cited

U.S. PATENT DOCUMENTS

| 6,181,013 | B1 | 1/2001 | Liu et al. | |
| 6,723,631 | B2 * | 4/2004 | Noguchi et al. | 438/618 |
| 6,806,191 | B2 | 10/2004 | Zistl et al. | |
| 7,229,921 | B2 * | 6/2007 | Hironaga et al. | 438/687 |
| 2002/0042193 | A1 * | 4/2002 | Noguchi et al. | 438/618 |
| 2003/0224599 | A1 | 12/2003 | Zistl et al. | |
| 2004/0097075 | A1 * | 5/2004 | Bradshaw et al. | 438/687 |

OTHER PUBLICATIONS

Gosset, et a., "Integration and performances of an alternative approach using copper silicide as a self-aigned barrier for 45 nm technology node Cu interconnects," IEEE, 2004; 0-7803-8308-7, pp. 15-17.

Hymes, et al., "Passivation of copper by silicide formation in dilute silane," American Institute of Physics, Journal of Applied Physics, vol. 71, No. 9, May 1, 1992, pp. 4623-4625.

Takewaki, et al., "A Novel Self-Aligned Surface-Silicide Passivation Technology for Reliability Enhancement in Copper Inteconnects," 1995 Symposium on VLSI Technology Digest of Technical Papers; 3B-4, pp. 31-32; Apr. 1995; 0-7803-2602-4/95.

* cited by examiner

*Primary Examiner*—Wai-Sing Louie
*Assistant Examiner*—Bilkis Jahan
(74) *Attorney, Agent, or Firm*—Gardere Wynne Sewell LLP

(57) ABSTRACT

A semiconductor product includes a portion made of copper, a portion made of a dielectric and a self-aligned barrier between the copper portion and the dielectric portion. The self-aligned barrier includes a first copper silicide layer comprising predominantly first copper silicide molecules, and a second copper silicide layer comprising predominantly second copper silicide molecules. The proportion of the number of silicon atoms is higher in the second silicide molecules than in the first silicide molecules. The second copper silicide layer is positioned between the copper portion and the first copper silicide layer. A nitride layer may overlie at least part of the first copper silicide layer.

22 Claims, 3 Drawing Sheets

US 7,687,399 B2

PRODUCTION OF A SELF-ALIGNED CUSIN BARRIER

PRIORITY CLAIM

The present application claims priority from French Patent Application No. 05 07269 filed Jul. 7, 2005, the disclosure of which is hereby incorporated by reference.

BACKGROUND OF THE INVENTION

1. Technical Field of the Invention

The present invention relates to the production of self-aligned barriers in microelectronics, for example, in integrated circuits.

2. Description of Related Art

Integrated circuits generally comprise barriers at the interface between a conducting region and an insulating region. The barriers prevent, for example, the diffusion of atoms from the conducting region into the insulating region.

FIG. 1 is a diagram of an example of a circuit portion according to the prior art. Conducting regions 1 and vias 2 are separated from a dielectric 5 by metal barriers 4 and by silicon nitride ($Si_3N_4$) barriers 3. The conducting regions 1 and the vias 2 are typically made of copper. The dielectric 5 may, for example, comprise fluorine-doped silicon oxide or FSG (fluorosilicate glass).

When a wafer of such a circuit is fabricated, the silicon nitride barriers 3 are deposited over the entire surface of the wafer. It is therefore necessary to carry out etching operations on the silicon nitride barriers 3 in order to create the places intended for the vias 2.

In addition, when a silicon nitride barrier is deposited over the entire surface of the wafer, as in the diagram shown in FIG. 1, the process is preceded by an initial copper deoxidation step. This is because copper oxide is relatively porous and brittle, facilitating the diffusion of copper atoms. Thus, when a relatively high current is applied to the circuit, there will be relatively weak retention of the copper atoms. Such a current may be applied so as to test the ageing resistance of the circuit. As a consequence, if the copper has not been correctly deoxidized before formation of the barrier, one ageing resistance characteristic of such a wafer risks being unsatisfactory.

U.S. Pat. No. 6,181,013 discloses a process for obtaining a layer comprising copper silicide molecules. A wafer comprising dielectric portions and copper portions on its surface is firstly cleaned. A plasma of nitrogen, ammonia and silane is then applied. This operation is carried out at about 400° C. This plasma results in the deposition of silicon nitride over the entire surface of the wafer. The silicon nitride deposited on the copper portions may react with the copper to form a layer comprising copper silicide molecules.

In applications of the imager type, light rays must pass through part of the circuit. Silicon nitride barriers distributed over the entire surface have the drawback that the light rays are partially refracted owing to the difference in optical index between the dielectric and the silicon nitride. This is because silicon nitride has a significantly higher optical index than the other dielectrics used.

FIG. 2 is a diagram of another example of a circuit portion according to the prior art. Conducting regions 1 and vias 2 are separated from a dielectric 5 by metal barriers 4 and by self-aligned barriers 6. The conducting regions 1 and the vias 2 are typically made of copper. The dielectric 5 may for example comprise FSG. The self-aligned barriers 6 are formed only on the copper.

The self-aligned barriers occupy only part of the surface of the wafer and thus prevent partial refraction of the light rays in imager applications.

The self-aligned barriers 6 may for example comprise silicon or cobalt.

When a self-aligned barrier comprising silicon is formed on copper, diffusion between copper atoms and silicon atoms of the self-aligned barrier generates a mixed copper silicide layer on the surface of the copper. This mixed layer allows better retention of the copper atoms when a relatively high current is applied to the circuit. Such a current may be applied so as to test the ageing resistance of the circuit. Consequently, a self-aligned barrier comprising silicon improves one ageing resistance characteristic of the circuit.

This advantage is also obtained with a self-aligned barrier comprising cobalt. This is because cobalt and copper only mix together at relatively high temperatures, above 422° C. A self-aligned barrier comprising cobalt therefore forms a good barrier to the diffusion of copper atoms. This barrier makes it possible to retain the copper atoms when a relatively high current is applied.

Self-aligned barriers comprising cobalt are fabricated by dipping the wafer into a solution. The solution reacts with copper, so that the barrier forms only on the surface of the copper. Such a process therefore requires the surface of the wafer to be prepared and certain parameters, such as the temperature and the pH, have to be controlled.

On the other hand, self-aligned barriers comprising silicon are relatively easy to produce, since their fabrication involves existing equipment.

The article "A novel self-aligned surface-silicide passivation technology for reliability enhancement in copper interconnects", by T. Takewaki, 1995 Symposium on VLSI Technology Digest of Technical Papers, describes a process for forming a self-aligned barrier. A wafer is firstly cleaned by annealing at 500° C., and then silane is introduced with no plasma at a temperature between 150° C. and 200° C. The article specifies that this temperature could be up to 400° C. Copper acts as a catalyst in the reaction of decomposing silane to silicon, so that silicon is formed on the copper surface. The wafer then undergoes an annealing operation at 450° C. for 30 minutes so as to form a self-aligned copper silicide layer.

The article "Passivation of copper by silicide formation in dilute silane" by S. Hyme, Journal of Applied Physics, Vol. 71, pages 4623-4625, (1992), describes that the silicide layer may comprise molecules of formula $Cu_5Si$, $Cu_{15}Si_4$ or even $Cu_3Si$.

There is a need to further improve the ageing resistance characteristic.

SUMMARY OF THE INVENTION

An embodiment of the invention is a semiconductor product comprising a portion made of copper, a portion made of a dielectric and a self-aligned barrier between the copper portion and the dielectric portion. The self-aligned barrier comprises a first copper silicide layer comprising first copper silicide molecules, and a second copper silicide layer comprising second copper silicide molecules. The proportion of silicon atoms is higher in the second molecules than in the first molecules.

The self-aligned barrier thus comprises two separate silicide layers, thereby providing greater retention of the copper atoms than the aligned barriers according to the prior art which comprise only a single layer. The copper atoms of the copper portion subjected to a relatively high voltage thus come up against two copper silicide layers. Consequently, the ageing resistance characteristic of the wafer is improved over the prior art.

The term "semiconductor product" is understood to mean a microelectronic product that comprises a substrate. The substrate is conventionally made of doped single-crystal silicon, but it may also be made of other materials. For example, the substrate may be flexible.

Advantageously, the second layer of the barrier lies between the copper portion and the first layer of the barrier. The layer with the highest silicon concentration is thus closest to the copper portion. The invention is not limited by the relative positions of the first and second layers.

Advantageously, the second molecules of the second layer have a stoichiometry such that the proportion of numbers of silicon atoms is greater than one third. The second layer may thus comprise predominantly molecules of formula $Cu_2Si$ or $CuSi$. The second layer thus has a relatively high concentration of silicon atoms, which helps to retain the copper atoms of the copper portion.

The invention is not limited by the stoichiometries of either the first molecules or of the second molecules.

An embodiment of the invention is also an imager comprising a microlens, a photodiode and at least one semiconductor product according to one aspect of the invention.

An embodiment of the invention is also a coil comprising a semiconductor product according to one aspect of the invention, the copper portion comprising copper lines of the coil.

Such an imager and such a coil represent examples of applications of the present invention but in no way limit the scope thereof.

An embodiment of the present invention is also a process for forming a self-aligned barrier on the surface of a copper portion of a semiconductor product wafer, comprising deoxidizing the wafer in order to remove oxygen atoms from the surface of the wafer, siliciding using silane introduced under an atmosphere, at a temperature above 350° C., and treating using a nitrogen-containing plasma.

This process makes it possible to obtain, surprisingly, a self-aligned barrier comprising two silicide layers, one of the layers having a higher silicon concentration than the other layer. The process therefore makes it possible to fabricate the semiconductor product according to one aspect of the invention.

Advantageously, the temperature lies in the range from 350° C. to 420° C., and is for example 400° C.

In an embodiment, an integrated circuit comprises a copper portion and a barrier structure self-aligned with and overlying the copper portion. The barrier structure includes a relatively higher silicon atom proportioned copper silicide layer overlying the copper portion and a relatively lower silicon atom proportioned copper silicide layer overlying the relatively higher silicon atom proportioned copper silicide layer.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

Two-layer self-aligned barrier

Figure 1:
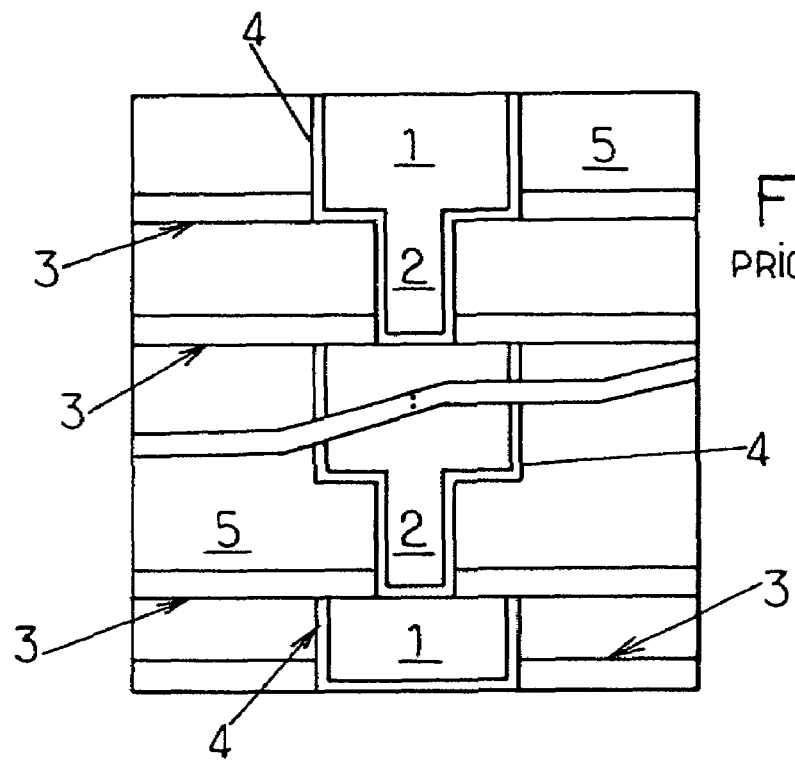
FIG. 1, already commented upon, is a diagram of an example of a circuit portion according to the prior art.
Figure 2:
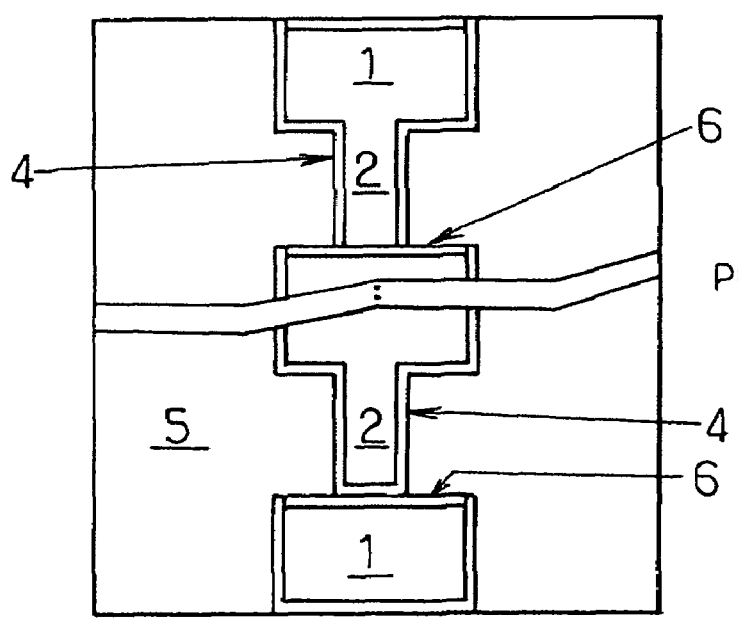
FIG. 2, already commented upon, is a diagram of another example of a circuit portion according to the prior art.
Figure 3:
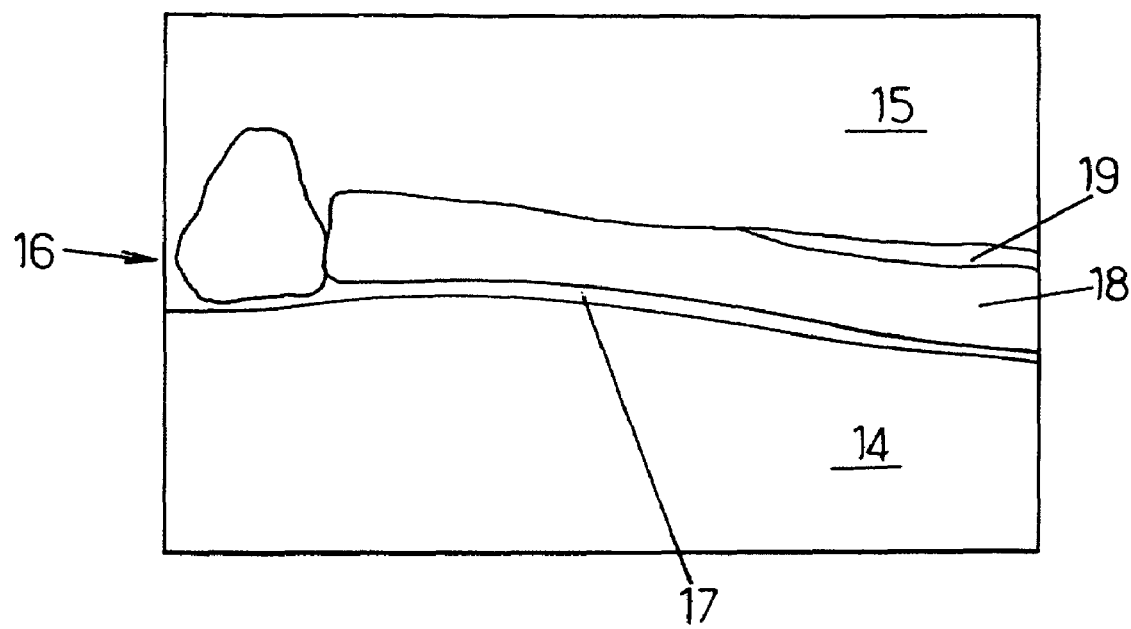
FIG. 3 is a schematic representation of an example of a portion of a semiconductor product according to one embodiment of the present invention.

The semiconductor product shown in FIG. 3 comprises a portion 14 made of copper and a portion 15 made of a dielectric, for example FSG. The copper portion 14 of FIG. 3 occupies the entire length of the semi-conductor product portion shown. However, the copper portion 14 occupies in general only part of the surface of a wafer. Typically, the copper portion forms part of the current conduction tracks in a microelectronic circuit.

A self-aligned barrier 16 lies between the copper portion 14 and the dielectric 15. The self-aligned barrier 16 is formed only on the copper portions. This self-aligned barrier comprises a first copper silicide layer 18 and a second copper silicide layer 17. The first layer 18 comprises predominantly first copper silicide molecules. The second layer 17 comprises predominantly second copper silicide molecules.

The term "predominantly" is understood to mean that the first layer 18 (or the second layer 17, respectively) may comprise, apart from the first copper silicide molecules (or the second copper silicide molecules, respectively), and in lower proportions, other molecules. These other molecules may comprise copper silicide molecules different from the first copper silicide molecules (or the second copper silicide molecules, respectively). These other molecules may also comprise molecules containing nitrogen or carbon, etc. The proportion of these other molecules in the first layer (or the second layer, respectively) may be not insignificant.

The proportion of the number of silicon atoms is higher in respect of the second silicide molecules than in respect of the first silicide molecules. The first silicide molecules may be molecules of formula $Cu_3Si$ and the second silicide molecules may be molecules of formula $Cu_2Si$, in particular when the self-aligned barrier 16 is relatively thin.

Thus, the second molecules have a stoichiometry such that the number proportion of silicon atoms is equal to one third. This relatively high proportion provides even better retention of the copper atoms when they are subjected to a relatively high voltage.

Alternatively, the first silicide molecules may be molecules of formula $Cu_2Si$ and the second silicide molecules may be molecules of formula $CuSi$, in particular when the self-aligned barrier 16 is relatively thick. Thus, the second molecules have a stoichiometry such that the number proportion of silicon atoms is equal to one half.

The second layer 17 lies between the copper portion 14 and the first layer 18. The second layer 17 may have a lower density than the density of the first layer 18.

Because of the presence of two copper silicide layers, the self-aligned barrier 16 provides relatively effective retention of the copper atoms of the copper layer 14.

The self-aligned barrier 16 may have a thickness of around 10 to 30 nm.

Nitrogen atoms may be deposited on the first layer 18 and form a third layer 19. The self-aligned barrier 16 may also comprise carbon atoms, oxygen atoms, etc.

Figure 4:
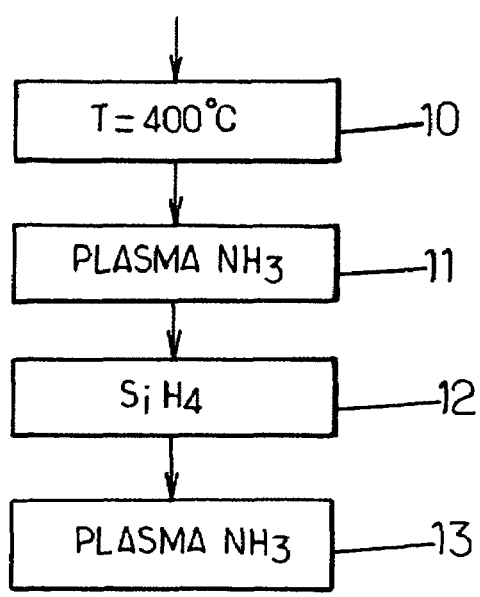
FIG. 4 is a flowchart of an example of a process for forming a self-aligned barrier according to a preferred embodiment of the present invention.

Such a self-aligned barrier may be formed by the process illustrated in FIG. 4.

Process for forming a self-aligned barrier

FIG. 4 is a flowchart of an example of a process for forming a self-aligned barrier according to a preferred embodiment of the present invention. According to this aspect of the invention, the process comprises a deoxidation step, a silicidation step and a step of treatment with a plasma comprising nitrogen atoms, indicated in the flowchart of FIG. 4 by the references 11, 12 and 13 respectively.

In the deoxidation step 11, the surface of the copper portions is deoxidized. This is because, should any oxygen atoms remain on the surface of the copper portions, silicon oxide ($SiO_2$) molecules would form during the decomposition of the silane during the silicidation step 13, thereby preventing the silicon atoms from diffusing into the copper. Consequently, there is a risk that one ageing resistance characteristic of such a wafer would not be optimum.

The present invention is not limited by the way in which the deoxidation step is carried out. For example, the deoxidation step may be performed by annealing in dihydrogen at 500° C., or by wet cleaning.

In the preferred embodiment, the deoxidation step 11 is carried out using an ammonia ($NH_3$) plasma. The ammonia may be diluted in dinitrogen ($N_2$) so as to increase the reactivity of the plasma. The ammonia plasma deoxidizes the surface of the copper portions. In addition, the wafer remains in a vacuum in the reactor after this deoxidation step 11, thereby preventing any contamination by dioxygen from the ambient air.

In this embodiment, the deoxidation step 11 is preceded by a step (not shown) during which the wafer is introduced into the reactor. The temperature of the wafer is stabilized during a thermalization step 10.

In this example, the temperature of the reactor is permanently maintained at 400° C.

After the deoxidation step 11 and a gas pumping step (not shown), silane ($SiH_4$) is introduced into the chamber in an atmosphere, that is to say without a plasma. The copper on the surface of the copper portions acts as a catalyst in a silane decomposition reaction. The silane therefore decomposes selectively on the surface of the copper portions. This silicidation step 12 is carried out at a temperature above 350° C. In the preferred embodiment, the reactor has a temperature of about 400° C., the effective temperature of the wafer generally being below this, for example between 350° C. and 400° C.

In the preferred embodiment, the silane is diluted in dinitrogen during the silicidation step. For example, the silane is diluted to 1% in dinitrogen.

The thickness of the self-aligned barrier formed depends on the duration of this step. Advantageously, the duration of this silicidation step 12 is around ten seconds.

In the step 13 or treatment with a plasma comprising nitrogen atoms, the silicon atoms of the self-aligned barrier thus formed are fixed. Thus, if thereafter the wafer is heated to relatively high temperatures, the diffusion of silicon atoms into the copper portion is reduced, or even blocked. Thus, the increase in electrical resistance of the copper portion is prevented. In addition, the nitrogen atoms deposited on the surface of the self-aligned barrier increase the hardness of the barrier. The self-aligned barrier is thus more resistant to etching and is generally more stable.

The step 13 is carried out using a plasma containing nitrogen atoms, that is to say a plasma containing nitrogen atoms. In the preferred embodiment, an ammonia plasma is used because this is particularly reactive. Of course, other nitrogen-containing plasmas may be used, for example a dinitrogen plasma.

Other steps may be applied subsequently to the wafer, in particular a dielectric deposition step.

The process according to the preferred embodiment results, surprisingly, in a self-aligned barrier comprising two copper silicide layers, such as the self-aligned barrier illustrated in FIG. 3.

It is possible that an initial silicide layer is formed after the silicidation step and that, during the subsequent step of treatment with a plasma containing nitrogen atoms, a depletion of silicon atoms is generated on the surface and over a certain thickness of this initial layer. Thus, the first layer, with a lower concentration of silicon atoms, would be formed by part of the initial layer touched by this depletion. The second layer would correspond to the deeper part of the initial silicide layer not touched by the depletion. This hypothesis would explain why the second layer, with a higher silicon concentration, is located between the copper portion and the first layer.

Example of Implementation of the Process

The thermalization step 10 may be carried out in a pressure of about 560 pascals (i.e., about 4.2 torr) in a dinitrogen atmosphere. The duration of the thermalization step 10 may be about 180 seconds.

In this embodiment, the deoxidation step 11 is carried out at a pressure of about 560 pascals. The temperature of the reactor is about 400° C., the effective temperature of the wafer generally being below this, between 350° C. and 400° C. Ammonia is introduced with a flow rate of about $5 \times 10^{-7}$ m$^3$/s (i.e., 30 cm$^3$/min) and dinitrogen is introduced with a flow rate of about $42 \times 10^{-6}$ m$^3$/s (i.e., about 2500 cm$^3$/min). A power of about 150 W is applied so as to create a plasma. The deoxidation step may last around ten seconds.

The silicidation step 12 may be carried out at a pressure of about 600 pascals (i.e., about 4.5 torr). Moreover, the silane is diluted in dinitrogen. For example, the silane is introduced with a flow rate of around $6.7 \times 10^{-7}$ m$^3$/s (i.e., about 40 cm$^3$/min) while the dinitrogen is introduced with a flow rate of around $6.7 \times 10^{-5}$ m$^3$/s (i.e., about 4000 cm$^3$/min).

A duration of the order of one minute may result in a thickness of about $2 \times 10^{-7}$ meters (i.e., 2000 Å). To avoid large strains in the crystal lattice, it is preferable to have a small thickness of the self-aligned barrier. Thus, a duration of around ten seconds may result in a thickness of about $3.6 \times 10^{-8}$ meters (i.e., 360 Å).

During the step 13 of treatment with a plasma containing nitrogen atoms, ammonia may be introduced, for example with a flow rate of $2.4 \times 10^{-6}$ m$^3$/s (i.e., about 145 cm$^3$/min). A power of about 500 W may be applied.

The step 13 may be carried out at a pressure of about 600 pascals (i.e., about 4.5 torr).

The duration of the step 13 may for example be 60 seconds.

Examples Of Applications

Figure 5:
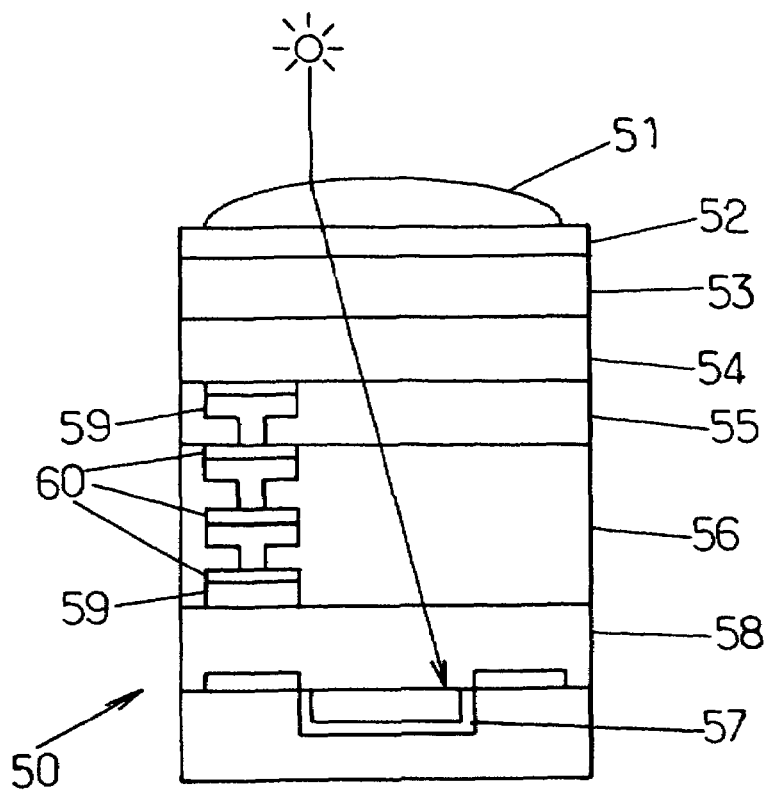
FIG. 5 shows a portion of an example of an imager according to one embodiment of the present invention.

FIG. 5 shows an example of a portion of an imager according to one embodiment of the present invention.

The imager portion 50 shown comprises a microlens 51 and a photodiode 57. A light ray, represented by an arrow, is deflected by the microlens 51 and reaches the photodiode 57 after having passed through various layers. The layers through which the light passes may comprise a planarization layer 52, a color film 53, a passivation layer 54 and a plurality of dielectric layers 55, 56, 58. The plurality of dielectric layers comprises two layers of undoped silicon dioxide or USG (undoped silica glass) 55, 58 and an FSG layer 56.

The imager 50 also comprises copper portions 59. These copper portions comprise for example electrical conduction tracks and vias between these tracks. According to one aspect of the invention, self-aligned barriers 60 comprising two copper silicide layers (not shown) lie between the copper portions and dielectric material. These self-aligned barriers 60 are deposited only on the copper portions 59. Thus, the light ray does not pass through the self-aligned barriers. USG and FSG have optical indices of 1.45 and 1.44, respectively. These indices are relatively close to each other, so that the light ray is only very partially refracted on passing through the dielectric layers 55, 56, 58.

Figure 6:
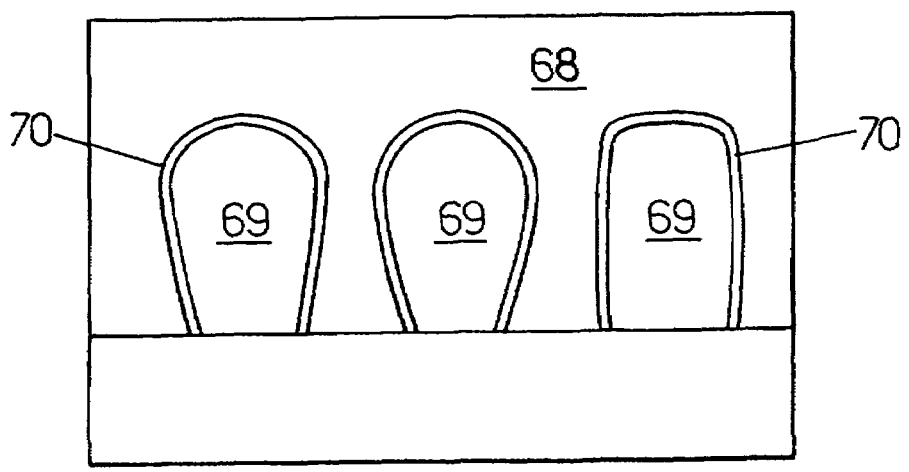
FIG. 6 shows a portion of a coil according to one embodiment of the present invention.

FIG. 6 shows a portion of a coil according to one embodiment of the present invention. Copper line portions 69 forming the coil are shown. These copper lines are embedded in a dielectric 68, for example benzocyclobutene (BCB). Self-aligned barriers 70 lie between the copper portions 69 and the dielectric 68.

These self-aligned barriers may be formed by applying the process according to one aspect of the invention. A self-aligned barrier formed on the surface of the copper portion by catalysis has an approximately equal thickness over the entire surface. This property may be particularly beneficial when this surface is curved, as is the case for coil lines.

In addition, these self-aligned barriers provide relatively effective retention of the copper atoms of the lines 69.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process, comprising:
   forming a self-aligned barrier on a surface of a copper portion of a semiconductor product wafer, wherein forming is accomplished by:
   deoxidizing the wafer in order to remove oxygen atoms from the surface of the wafer;
   siliciding, with silane introduced in an atmosphere, at a temperature above 350° C. to produce a silicided metal surface; and
   treating the silicided metal surface with a plasma containing nitrogen atoms;
   wherein forming produces the self-aligned barrier to include a first copper silicide layer and a second copper silicide layer, the second copper silicide layer being located between the first copper silicide layer and the copper portion and having a higher proportion of silicon atoms than the first copper silicide layer.

2. The process of claim 1, wherein the plasma containing nitrogen comprises an ammonia plasma.

3. The process of claim 1, wherein the deoxidation step is carried out using an ammonia plasma.

4. The process of claim 1, wherein the silicidation step lasts around ten seconds.

5. The process of claim 1, wherein the silane is diluted in dinitrogen during siliciding.

6. A process, comprising:
   forming a self-aligned barrier on a surface of a copper portion of a semiconductor product wafer, wherein forming is accomplished by:
   deoxidizing the wafer in order to remove oxygen atoms from the surface of the wafer;
   siliciding, with silane introduced in an atmosphere, at a temperature above 350° C.; and
   treating with a plasma containing nitrogen atoms;
   wherein the formed self-aligned barrier includes a first copper silicide layer and a second copper silicide layer, the second copper silicide layer being located between the first copper silicide layer and the copper portion and having a higher proportion of silicon atoms than the first copper silicide layer.

7. The process of claim 6, wherein the formed self-aligned barrier further includes a nitrogen-based layer over at least a portion of the first copper silicide layer.

8. The process of claim 6, wherein the plasma containing nitrogen comprises an ammonia plasma.

9. The process of claim 6, wherein the deoxidation step is carried out using an ammonia plasma.

10. The process of claim 6, wherein the silicidation step lasts around ten seconds.

11. The process of claim 6, wherein the silane is diluted in dinitrogen during siliciding.

12. A process, comprising:
    forming a self-aligned barrier on a surface of a copper portion of a semiconductor product wafer, wherein forming is accomplished by:
    deoxidizing the wafer in order to remove oxygen atoms from the surface of the wafer;
    then siliciding with silane introduced in an atmosphere to produce a metal silicide layer; and
    then treating the metal silicide layer after siliciding with a plasma containing nitrogen atoms;
    wherein treating forms the formed self-aligned barrier to include a first copper silicide layer and a second copper silicide layer, the second copper silicide layer being located between the first copper silicide layer and the copper portion and having a higher proportion of silicon atoms than the first copper silicide layer.

13. The process of claim 12, wherein the plasma containing nitrogen comprises an ammonia plasma.

14. The process of claim 12, wherein the deoxidation step is carried out using an ammonia plasma.

15. The process of claim 12, wherein the silicidation step lasts around ten seconds.

16. The process of claim 12, wherein the silane is diluted in dinitrogen during siliciding.

17. The process of claim 12, wherein the formed self-aligned barrier further includes a nitrogen-based layer over at least a portion of the first copper silicide layer.

18. A process, comprising:
    forming a self-aligned barrier in an integrated circuit that is located between a portion made of copper and a portion made of a dielectric, the self-aligned barrier comprising:
    a first copper silicide layer comprising predominantly first copper silicide molecules; and
    a second copper silicide layer comprising predominantly second copper silicide molecules, the proportion of the number of silicon atoms being higher in the second molecules than in the first molecules.

19. The process of claim 18, wherein forming the self-aligned barrier further comprises forming a nitrogen-based layer over at least a portion of the first copper silicide layer.

20. The process of claim 18, wherein the second layer lies between the copper portion and the first layer.

21. The process of claim 18, wherein the second copper silicide molecules have a stoichiometry such that the proportion of the number of silicon atoms is greater than one third.

22. The process of claim 18, wherein the second copper silicide layer is located between the first copper silicide layer and the copper portion.

* * * * *